(12) United States Patent
Cheng et al.

(10) Patent No.: US 9,484,306 B1
(45) Date of Patent: Nov. 1, 2016

(54) MOSFET WITH ASYMMETRIC SELF-ALIGNED CONTACT

(71) Applicants: International Business Machines Corporation, Armonk, NY (US); GlobalFoundries, Inc., Grand Cayman (KY)

(72) Inventors: Kangguo Cheng, Schenectady, NY (US); Xin Miao, Guilderland, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/943,663

(22) Filed: Nov. 17, 2015

(51) Int. Cl.
| | | |
|---|---|---|
| *H01L 21/70* | (2006.01) | |
| *H01L 23/535* | (2006.01) | |
| *H01L 21/8238* | (2006.01) | |
| *H01L 21/768* | (2006.01) | |
| *H01L 27/092* | (2006.01) | |
| *H01L 23/528* | (2006.01) | |

(52) U.S. Cl.
CPC ....... *H01L 23/535* (2013.01); *H01L 21/76805* (2013.01); *H01L 21/76816* (2013.01); *H01L 21/76895* (2013.01); *H01L 21/823821* (2013.01); *H01L 21/823842* (2013.01); *H01L 21/823871* (2013.01); *H01L 23/5283* (2013.01); *H01L 27/0922* (2013.01); *H01L 27/0924* (2013.01)

(58) Field of Classification Search
CPC ............ H01L 23/535; H01L 23/5283; H01L 21/76805; H01L 21/76816; H01L 21/76895; H01L 21/823821; H01L 21/823842; H01L 27/0922; H01L 27/0924
USPC ........................................................ 257/369
See application file for complete search history.

(56) References Cited

U.S. PATENT DOCUMENTS

| 7,309,626 B2 | 12/2007 | Ieong et al. |
| 7,348,642 B2 | 3/2008 | Nowak |

(Continued)

OTHER PUBLICATIONS

Kangguo Cheng, et al.; "MOSFET with Asymmetric Self-Aligned Contact"; U.S. Appl. No. 15/149,286, filed May 9, 2016.

(Continued)

*Primary Examiner* — Matthew Gordon
(74) *Attorney, Agent, or Firm* — Cantor Colburn LLP; Vazken Alexanian

(57) ABSTRACT

A semiconductor device includes a source and drain on a substrate; a first and second gate on the source, and the second gate and a third gate on the drain; a source contact over the source and between the first and second gates, the source contact including first and second portions, the first portion in contact with the source and extending between the first and second gates, and the second portion contacting the first portion and extending over the first and second gates; and a drain contact formed over the drain and between the second and third gates, the drain contact including first and second portions, the first portion contacting the drain, extending between second and third gates, and recessed with respect to the first portion of the source contact, and the second portion in contact with the first portion and extending between and over the second and third gates.

6 Claims, 8 Drawing Sheets

(56) References Cited

U.S. PATENT DOCUMENTS

| | | |
|---|---|---|
| 7,768,006 B2 | 8/2010 | Zhu et al. |
| 8,053,314 B2 | 11/2011 | Anderson et al. |
| 8,772,874 B2 | 7/2014 | Cheng et al. |
| 8,941,180 B2 | 1/2015 | Anderson et al. |
| 2012/0086054 A1* | 4/2012 | Cheng .................. H01L 23/485 257/288 |
| 2013/0049115 A1* | 2/2013 | Cheng ............... H01L 29/66803 257/347 |
| 2014/0197377 A1* | 7/2014 | Kim ...................... H01L 27/092 257/29 |
| 2015/0069532 A1 | 3/2015 | Xie et al. |
| 2015/0129988 A1 | 5/2015 | Leobandung |

OTHER PUBLICATIONS

List of IBM Patents or Patent Applications Treated as Related—Date Filed: May 12, 2016; 1 page.

* cited by examiner

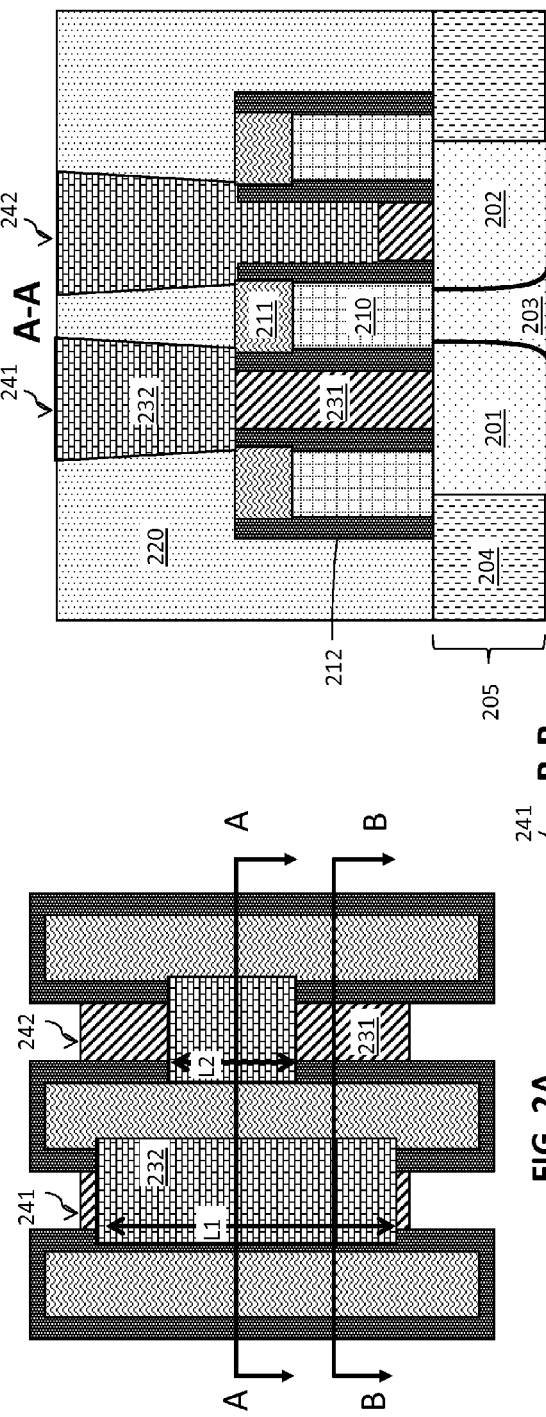
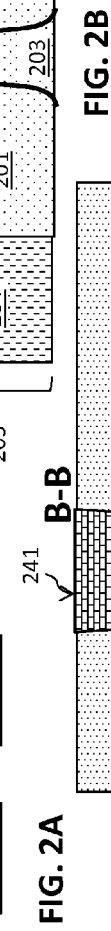
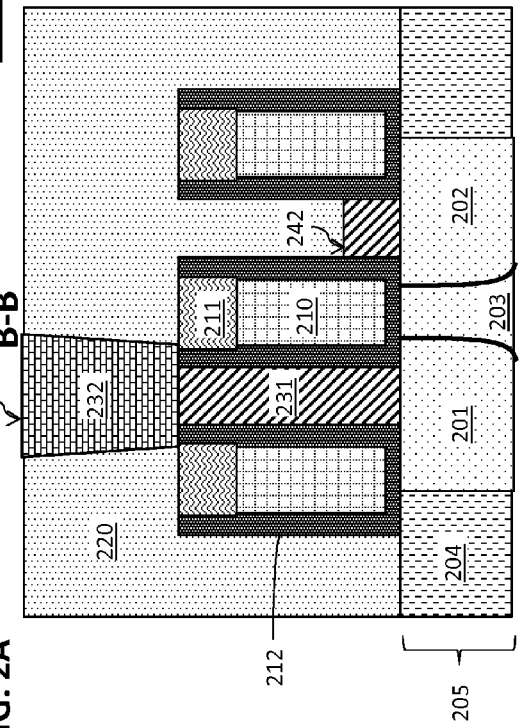
FIG. 2A
FIG. 2B
FIG. 2C

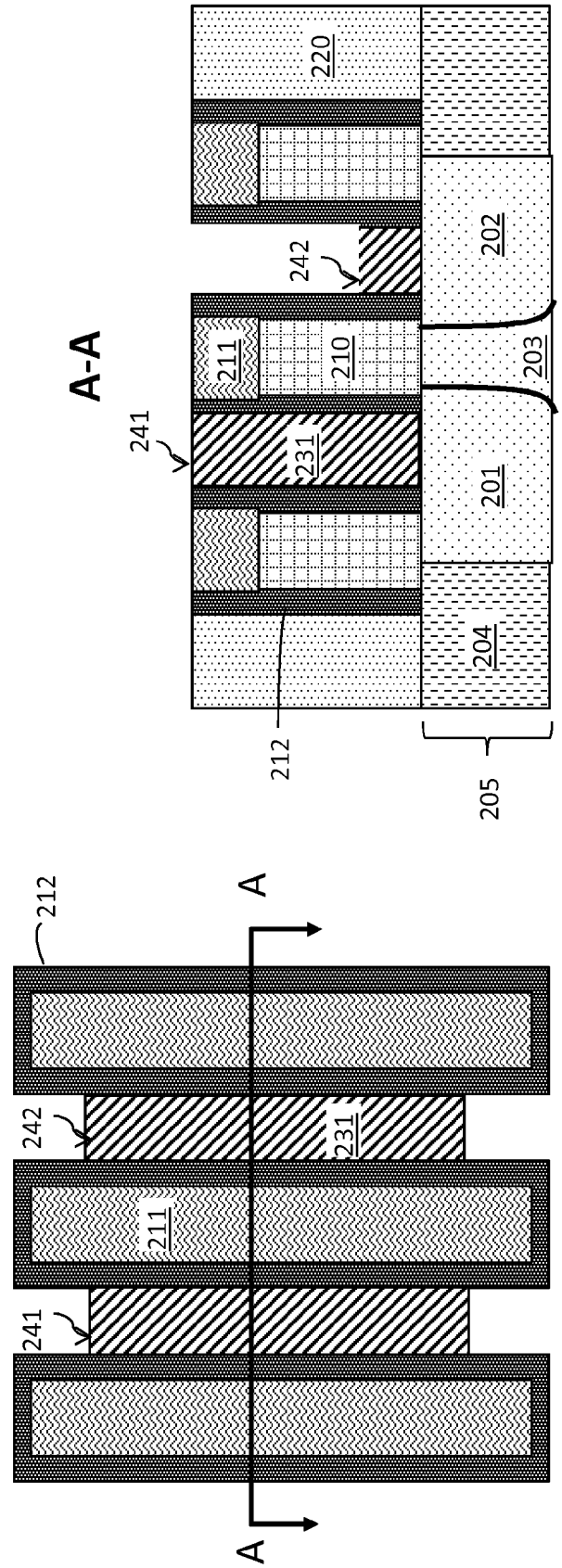

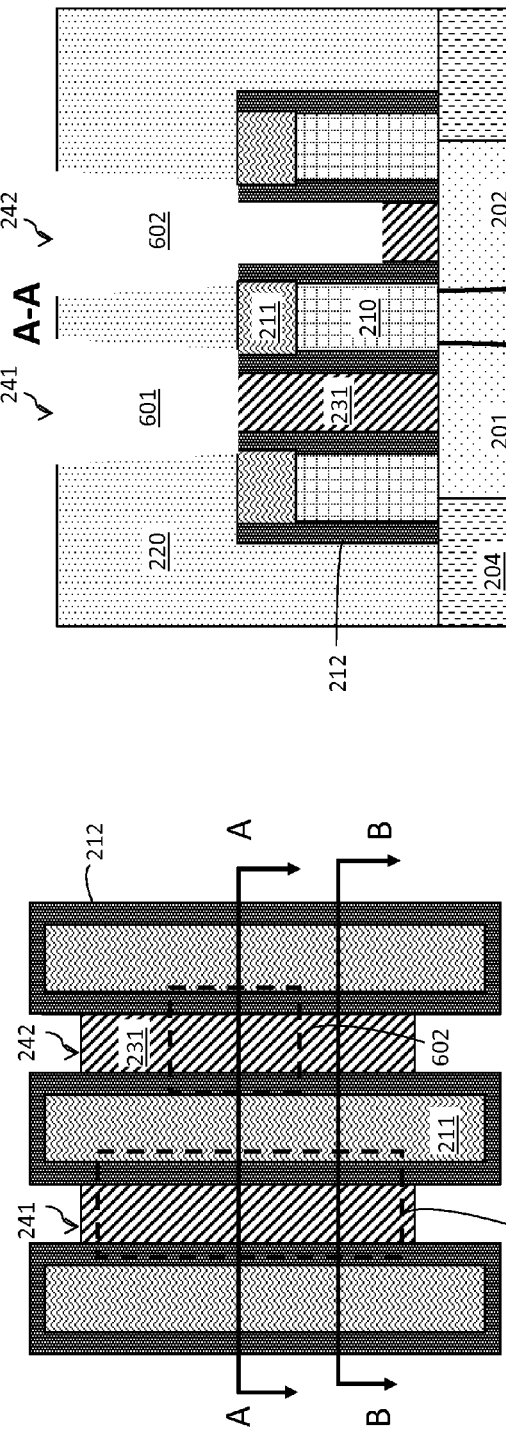
FIG. 6A
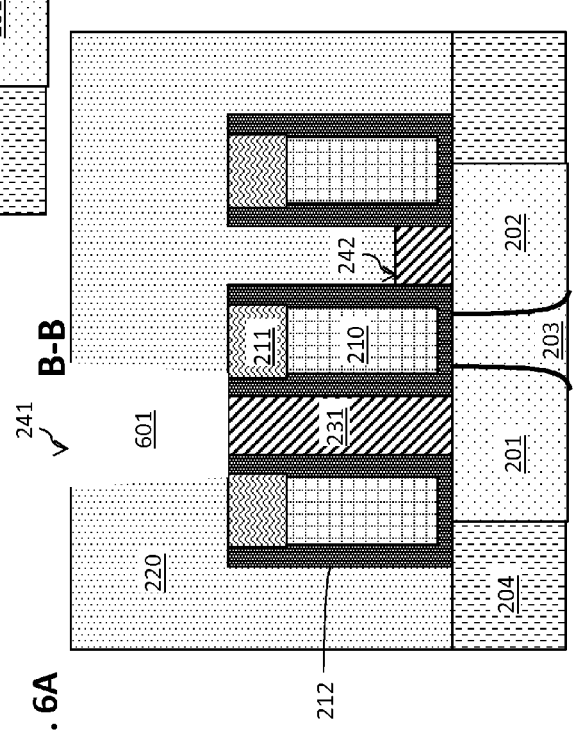
FIG. 6B
FIG. 6C

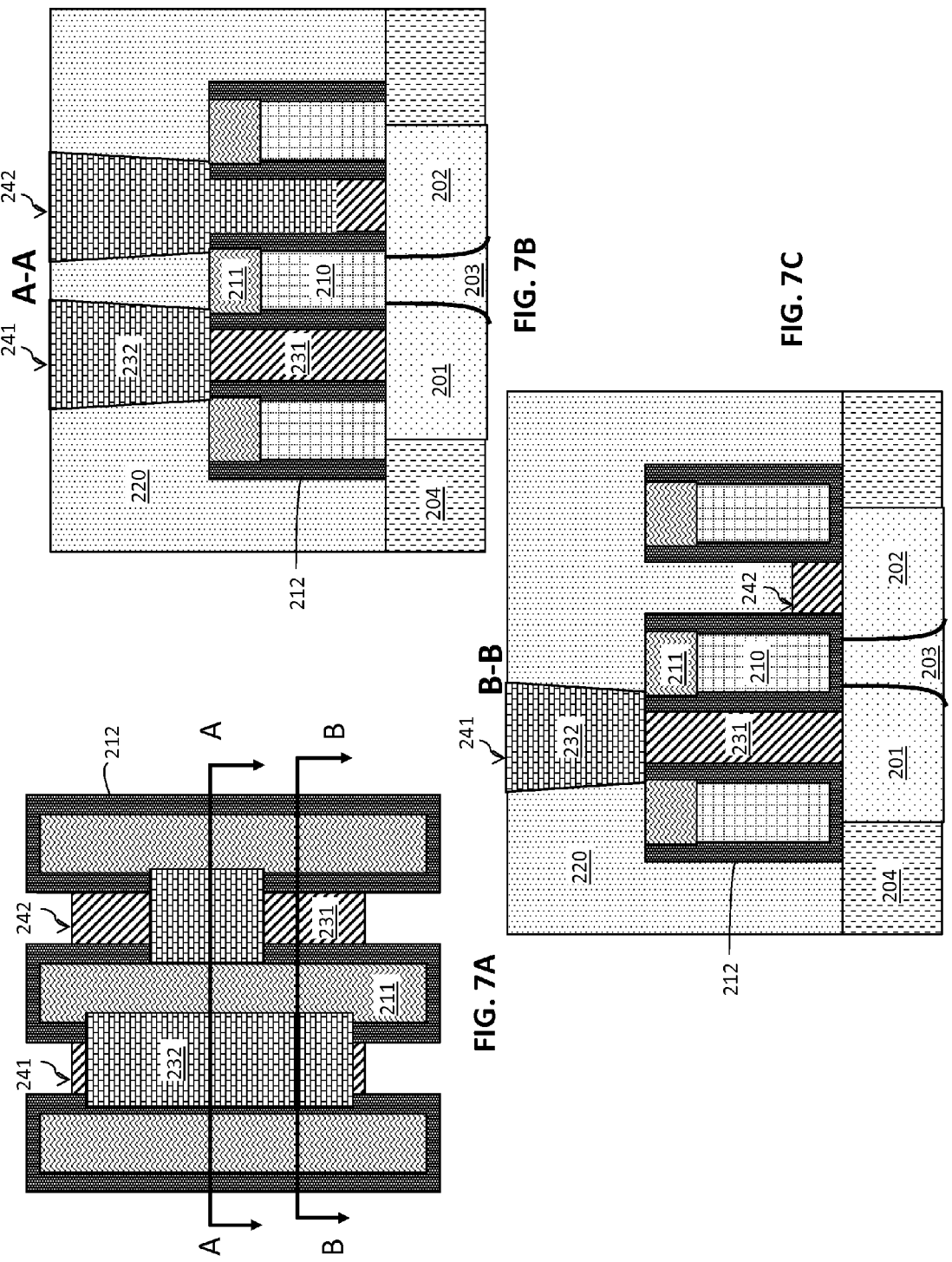

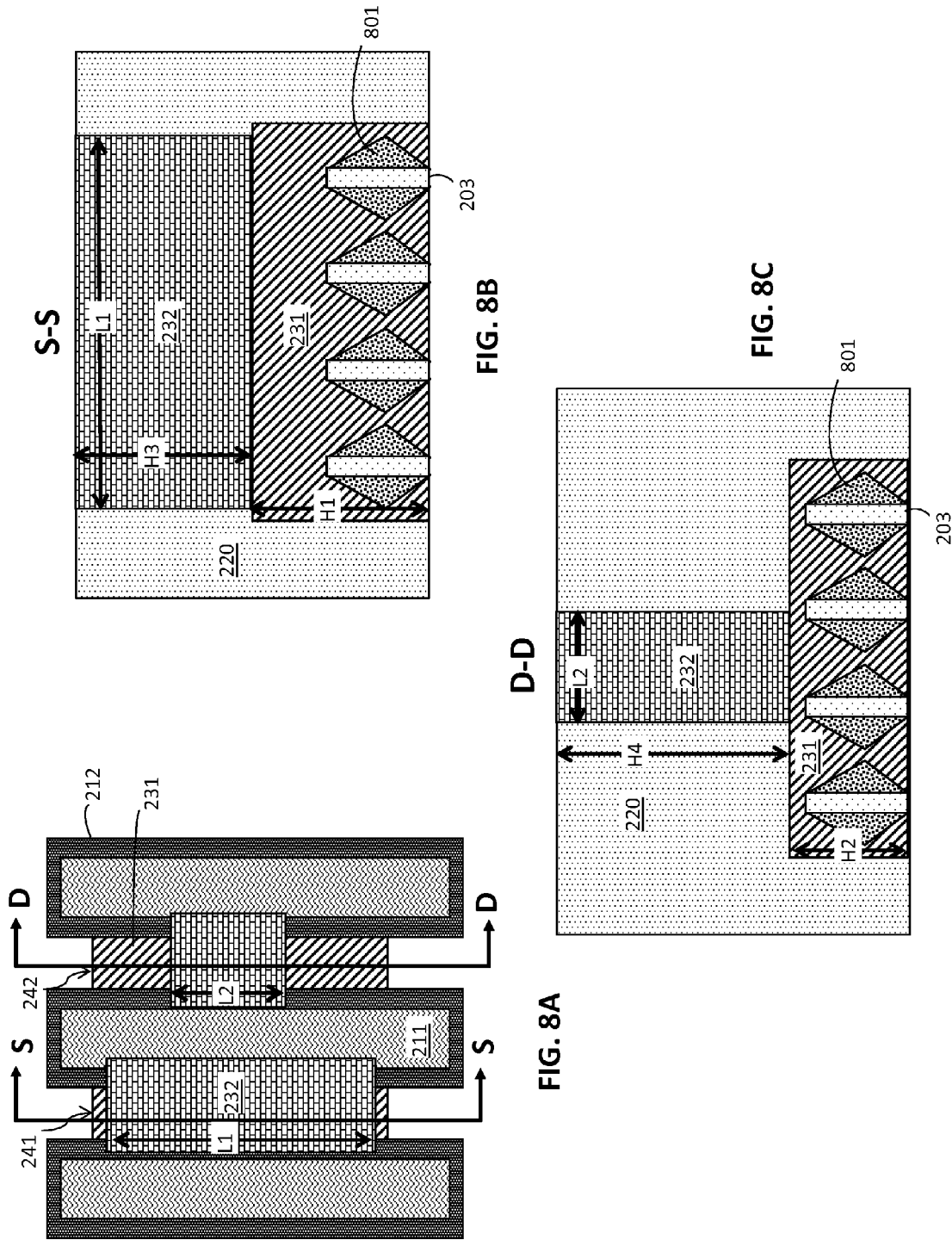

US 9,484,306 B1

MOSFET WITH ASYMMETRIC SELF-ALIGNED CONTACT

BACKGROUND

The present invention relates to metal-oxide-semiconductor field-effect transistors (MOSFET), and more specifically, to source/drain contacts.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

According to an embodiment, a method of making a semiconductor device includes forming a source and a drain on a substrate; forming a first gate, a second gate, and a third gate on the substrate, the first gate being in contact with the source, the second gate being in contact with the source and the drain, and the third gate being in contact with the drain; forming a first portion of a source contact on the source, the first portion of the source contact contacting the source and extending between the first gate and the second gate; forming a first portion of a drain contact on the drain, the first portion of the drain contact contacting the source and extending between the second gate and the third gate; recessing the first portion of the drain contact to a level below a surface of the gate; forming a second portion of the source contact on the first portion of the source contact, the second portion contacting the first portion and extending over the first gate and the second gate; and forming a second portion of the drain contact on the first portion of the drain contact, the second portion contacting the first portion and extending between and over the second gate and the third gate.

According to another embodiment, a method of making a semiconductor device includes forming a source and a drain on a substrate; forming a first gate, a second gate, and a third gate on the substrate, the first gate being in contact with the source, the second gate being in contact with the source and the drain, and the third gate being in contact with the drain; forming a first portion of a source contact on the source, the first portion of the source contact contacting the source and extending between the first gate and the second gate; forming a first portion of a drain contact on the drain, the first portion of the drain contact contacting the drain and extending between the second gate and the third gate; removing a portion of the first portion of the drain contact such that the first portion of the drain contact has a height that is less than a height of the first portion of the source contact; forming a second portion of the source contact on the first portion of the source contact, the second portion contacting the first portion and extending over the first gate and the second gate; and forming a second portion of the drain contact on the first portion of the drain contact, the second portion contacting the first portion and extending between and over the second gate and the third gate.

Yet, according to another embodiment, a semiconductor device includes a source and a drain positioned on a substrate; a first gate and a second gate disposed on the source, and the second gate and a third gate disposed on the drain; a source contact formed over the source and between the first gate and the second gate, the source contact including a first portion and a second portion, the first portion being in contact with the source and extending between the first gate and second gate, and the second portion contacting the first portion and extending over the first gate and the second gate; and a drain contact formed over the drain and between the second gate and the third gate, the drain contact including a first portion and a second portion, the first portion positioned in contact with the drain, extending between the second gate and the third gate, and recessed with respect to the first portion of the source contact, and the second portion positioned in contact with the first portion and extending between and over the second gate and the third gate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 2A-2C illustrate a semiconductor device according to various embodiments, in which:

FIG. 2A is a top view;

FIG. 2B is a cross-sectional side view through the A-A axis of FIG. 2A; and

FIG. 2C is a cross-sectional side view through the B-B axis of FIG. 2A;

FIGS. 3A-8C illustrate exemplary methods of making semiconductor devices according to various embodiments, in which:

FIG. 3A is a top view showing gates formed on fins;

FIG. 4A is a top view after forming first portions of the source and drain contacts;

FIG. 4B is a cross-sectional side view through the A-A axis of FIG. 4A;

FIG. 6A is a top view after patterning the second portion of the source and drain contacts in the ILD;

FIG. 6B is a cross-sectional side view through the A-A axis of FIG. 6A;

FIG. 6C is a cross-sectional side view through the B-B axis of FIG. 6A;

FIG. 7A is a top view after depositing a conductive material in the contact trenches;

FIG. 7B is a cross-sectional side view through the A-A axis of FIG. 7A;

FIG. 7C is a cross-sectional side view through the B-B axis of FIG. 7A;

FIG. 8A is a top view showing the source contact and the drain contact between the gates;

FIG. 8B is a cross-sectional side view through the S-S axis of FIG. 8A; and

FIG. 8C is a cross-sectional side view through the D-D axis of FIG. 8A.

DETAILED DESCRIPTION

As semiconductor devices scale to smaller dimensions of contacted gate pitch (e.g., below 80 nanometers (nm)), self-aligned contacts (SAC) may be used to make contacts in complementary metal oxide semiconductor (CMOS) fabrication. In some SAC devices, the conductive source/drain contacts may substantially overlap with the conductive metal gates and are separated by a thin dielectric spacer, which may increase parasitic capacitance between the gate and the SAC. The parasitic capacitance can reduce device performance and increase power consumption.

Figure 1:
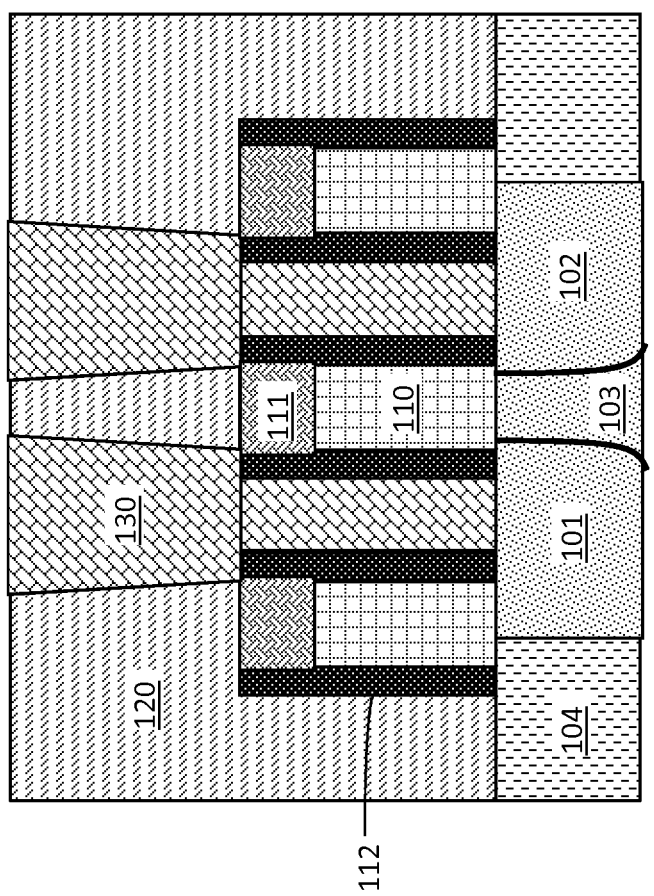
FIG. 1 illustrates a semiconductor device with source and drain contacts that substantially overlap the gates.

For example, FIG. 1 illustrates a semiconductor device with source/drain contacts 130 that substantially overlap the gates 110. A fin 103 is patterned in the substrate. The substrate includes shallow trench isolation (STI) regions 104 between the fins 103. A spacer 112 is positioned on a sidewall of the gate 110. A gate cap 111 is positioned on a surface of the gate 110. The gates 110 are formed on a substrate that includes a source 101 and a drain 102. The source/drain contacts 130 include portions that contact the source 101 and the drain 102 and extend between and over the gates 110. The source/drain contacts 130 substantially overlap the gates 110, which may increase parasitic capacitance between the conductive source/drain contact 130 and conductive gate 110.

Accordingly, in contrast to the structure shown in FIG. 1, various embodiments described herein provide semiconductor devices and methods of making semiconductor devices to mitigate parasitic capacitance that may result from a SAC. The SAC includes two portions, a first portion between the gates and a second portion over the gates. On the source side, the first and second portions of the SAC are disposed on multiple fins and overlap with the gate. The source side structure reduces resistance.

On the drain side, the first portion between the gates in contact with the source is positioned on multiple fins, but the first portion is recessed to a level below the top of the gate to reduce parasitic capacitance. The second portion of the SAC on the drain side contacts the first portion and only overlaps with a small portion of the gate. Although the asymmetric SAC configuration may increase resistance, the reduced drain side parasitic capacitance (Miller Effect) may have a greater effect on device performance. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Turning again to the Figures, FIGS. 2A-2C illustrate a semiconductor device according to various embodiments. FIG. 2A is a top view. FIG. 2B is a cross-sectional side view through the A-A axis of FIG. 2A. FIG. 2C is a cross-sectional side view through the B-B axis of FIG. 2A. Methods of making the semiconductor device shown in FIGS. 2A-2C are described in further detail in FIGS. 3A-8C.

Fins 203 are formed in a substrate 205. A source 201 and a drain 202 are formed in the substrate 205. Shallow trench isolation (STI) regions 204 are formed in the substrate 205 between fins 205. Gates 210 are formed on the substrate 205 in contact with the source 201 and drain 202. A spacer 212 is positioned along sidewalls of the gates 210. A gate cap 211 is positioned on a surface of the gates 210. An ILD 220 is disposed on and around the gates 210 (not shown in FIG. 2A).

A source contact 241 is formed on the source 201. The source contact 241 includes a first portion 231 in contact with the source 201 and extending between the gates 210 to a surface of the gate cap 211. The source contact 241 includes a second portion 232 disposed on the first portion 231. The second portion 232 is positioned over the gates 210 and substantially covers the source 201 (active region), which provides low resistance.

A drain contact 232 is formed on the drain 202. The drain contact 242 includes a first portion 231 in contact with the drain 202. The first portion 231 is recessed below the level of the gate 210 to reduce capacitance, as shown in FIG. 2C. The ILD 220 fills the space between the gates 210 above the recessed first portion 231 (see FIGS. 2A and 2C). The drain contact 242 includes a second portion 232 disposed on the first portion 231 that has a length (L2) that is smaller than the length (L1) of the second portion 232 of the source contact 241. The second portion 232 of the drain contact 242 extends over the gates 210 and between the gates 210 to contact the first portion 231. The reduced size of the second portion 232 and the recessed first portion 231 reduces parasitic capacitance because less of the drain contact 242 contacts the gate 210.

Figure 3B:
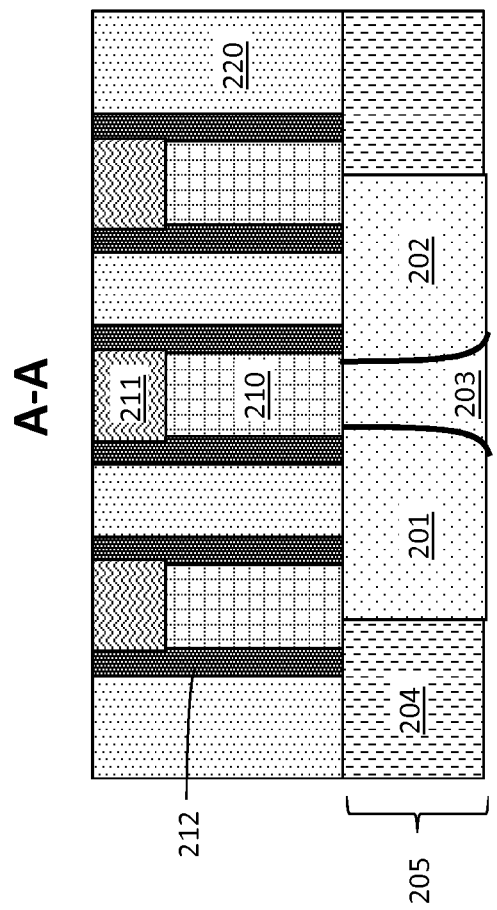
FIG. 3B is across-sectional side view through the A-A axis of FIG. 3A.
Figure 3A:
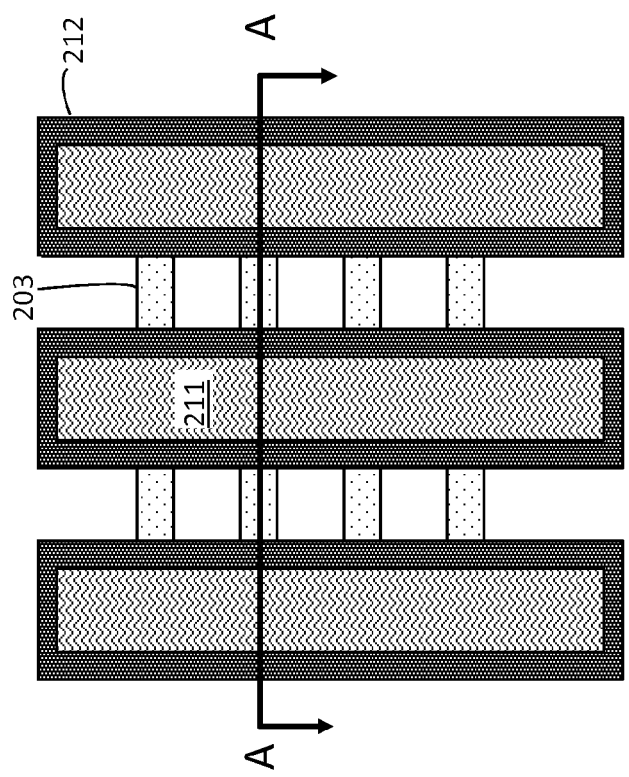

FIGS. 3A-8C illustrate exemplary methods of making semiconductor devices according to various embodiments. FIG. 3A is a top view showing gates 210 disposed on fins 203. FIG. 3B is across-sectional side view through the A-A axis of FIG. 3A. For clarity, the ILD 220 is not shown in FIG. 3A.

The substrate 205 may include one or more semiconductor materials, including, but not limited to, Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

The substrate 205 may be formed using, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The semiconductor device may be a FinFET, as shown in FIGS. 3A and 3B. In other embodiments, however, the semiconductor device may be a planar FET, a nanowire FET, or other semiconductor device.

In a FinFET, fins 203 are patterned and formed in the substrate 205. The FinFET may include any number of fins 203 arranged in a fin array. The fins 203 may be patterned in the substrate 205 by, for example, sidewall imaging transfer. After patterning, the fins 203 are formed by etching the substrate 205.

A STI process is performed to form the STI regions 204 in the substrate 205. The STI regions 204 are isolation regions formed by etching trenches in the substrate 205 and then filling the trenches with at least one dielectric material, for example, silicon dioxide. Other non-limiting examples of suitable dielectric materials for the STI regions 204 include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof. In some embodiments, the substrate 205 is a silicon-on-insulator (SOI) and the STI process can be omitted.

A source 201 and a drain 202 (active areas) are formed on the substrate 205. An epitaxial growth process may be performed to deposit epitaxial growth onto the substrate 205. Epitaxial growth may be formed using chemical vapor deposition (CVD), vapor-phase epitaxy (VPE), molecular-beam epitaxy (MBE), liquid-phase epitaxy (LPE), or other suitable process. The epitaxial growth may be doped during deposition. Alternatively, the source 201 and drain 202 may be formed by incorporating dopants into the substrate 205.

Gates 210 are formed on the substrate 205. In some embodiments, a first gate, a second gate, and a third gate are formed on the substrate 201. The first gate contacts the source 201, the second gate contacts both the source 201 and the drain 202, and the third gate contacts the drain 202.

The gates 210 include a gate stack with one or more dielectric materials, one or more workfunction metals, and one or more metal gate conductor materials. The gates 210 may be formed either by a replacement metal gate process, i.e., replacing a dummy gate (including a sacrificial gate material), or by gate-first process, i.e., directly forming the gates 210 on fins. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hathium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

A gate spacer 212 is positioned along a sidewall of the gate 210. An insulating material, for example, silicon dioxide, silicon nitride, SiOCN, or SiBCN, is deposited on the dummy gate material before forming the gates 210 to form the gate spacers 212. The gate spacer 212 material is deposited by a deposition process, for example, chemical vapor deposition (CVD) or physical vapor deposition (PVD).

To form a gate cap 211 on the gates 210, a portion of the gate stack may be removed to form a recess. The recess may be formed by performing an etch process. An insulating hard mask layer, for example, silicon nitride, SiOCN, or SiBCN is deposited on the gates 210 to form the gate cap 211. The material forming the gate cap 211 may be deposited using a deposition process, including, but not limited to, PVD, CVD, PECVD, or any combination thereof.

An interlayer dielectric (ILD) 220 is disposed on and around the gates 210 and substrate 205 (not shown in FIG. 3A). The ILD 220 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 220 may be deposited by a deposition process, including, but not limited to CVD, PVD, plasma enhanced CVD (PECVD), atomic layer deposition (ALD), evaporation, chemical solution deposition, or like processes.

FIG. 4A is a top view after forming first portions 231 of the source contact 241 and drain contact 242. FIG. 4B is a cross-sectional side view through the A-A axis of FIG. 4A. The first portions 231 of the source contact 241 and the drain contact 242 extend over the array of fins 203 between the gates 210 (see FIG. 3A). The first portion 231 of the source contact 241 extends between first and second gates, and the first portion 231 of the drain contact 242 extends between second and third gates. The drain contact 242 is recessed to a level below the gate 210 height (surface).

Multiple masks may be used to form the first portions 231. In one embodiment, a mask/resist may be disposed on the gates 210 and ILD 220. Portions of the mask may be simultaneously removed over the source 201 and drain 202 to form a pattern. The mask/resist pattern is transferred into the ILD 220 by removing portions of the ILD 220 between the gates 210 down to the level of the source 201 and drain 202 to form contact trenches. The contact trenches are filled with a conductive material or a combination of conductive materials. In one embodiment, the contact trenches are filled with a conductive liner (e.g., titanium followed by tungsten. In another embodiment, the contact trenches are filled with a metal silicide film and a conductive material up to the level of at least the gate 210, or in some embodiments, the level of the gate cap 211. Then another protective mask may be disposed on the source side over the first portion 231 of the source contact 241. An etch process is then used to remove (recess) a portion of the first portion 231 of the drain contact 242.

In another embodiment, the first portion 231 of the source contact 241 and the first portion of the drain contact 242 may be formed sequentially. For example, a protective mask may be disposed over the source 201 or drain 202, and the first portion 231 of either exposed side may then be formed by depositing a conductive material or a combination of conductive materials in the contact trenches, as described above.

The first portion 231 of the drain contact 242 is recessed after depositing the conductive material.

In some embodiments, the metal silicide film may be formed by performing a thermal treatment to a metallic film. The metallic film can be deposited by performing, for example, an evaporation process or a sputtering process. The metallic film is then annealed by heating inside a furnace or performing a rapid thermal treatment in an atmosphere that includes pure inert gases (e.g., nitrogen or argon). Non-limiting examples of suitable metal silicide materials include titanium silicide, tungsten silicide, cobalt silicide, nickel silicide, molybdenum silicide, platinum silicide, or any combination thereof. In other embodiments, the above metal silicide forming process is not included. A metal silicide may be formed between the contacts and the semiconductor source/drain by reacting the contact liner with the semiconductor.

The first portion 231 of the source contact 241 and the first portion 231 of the drain contact may include other additional liners and/or layers to reduce resistance. A conductive material is then deposited in contact trenches over the metal silicide film and liners, when present. The conductive material may be, but is not limited to, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any excess materials from the surface of the ILD 220, gate cap 211, and the gate spacers 212.

The first portion 231 of the drain contact 242 is recessed by removing a portion using an etch process. The etch process may be, for example, a reactive ion etch (RIE) process containing fluorine.

The first portion 231 of the drain contact 242 is recessed below the level of the gates 210 (second and third gates) or the gate cap 211. The first portion 231 of the drain contact 242 has a height that is less than the height of the first portion 231 of the source contact 242. The first portion 231 of the source contact 241 may extend to about the surface of the gate cap 211.

Figure 5B:
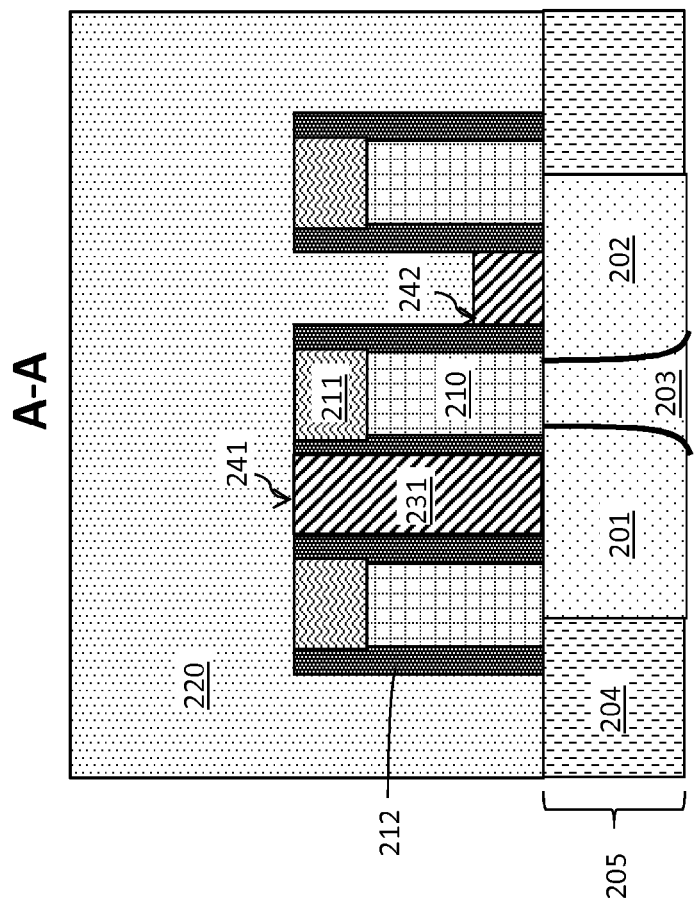
FIG. 5B is a cross-sectional side view through the A-A axis of FIG. 5A.
Figure 5A:
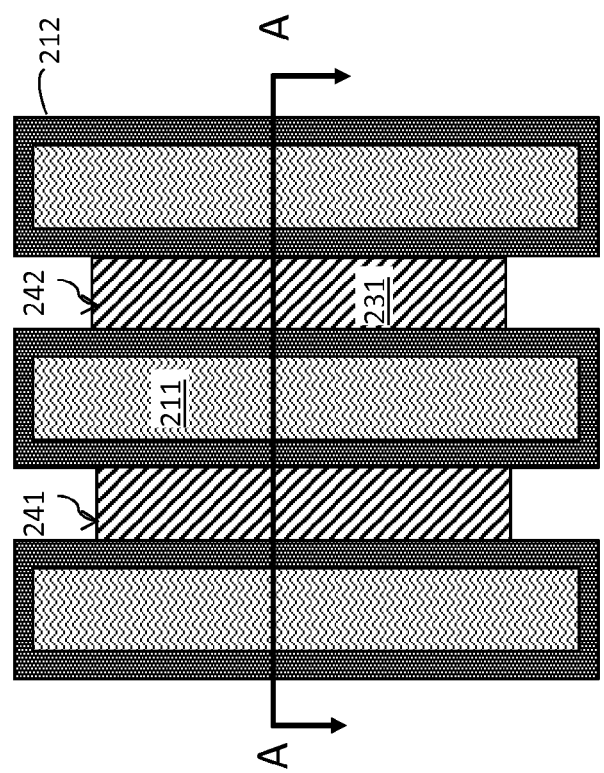
FIG. 5A is a top view after depositing a interlayer dielectric (ILD) on the gates and the source and drain contacts.

FIG. 5A is a top view after depositing more ILD 220 on the gates 210 and first portions 231 of the source and drain contacts 241, 242. FIG. 5B is a cross-sectional side view through the A-A axis of FIG. 5A. For clarity, the ILD 220 is now shown in FIG. 5A.

The ILD 220 may be the same material disposed adjacent to the gates 210. The ILD 220 also may be a different material than the material adjacent to the gates 210.

The ILD 220 contacts the first portion 231 of the source contact 241 and the first portion 231 of the drain contact 242. Because the first portion 231 of the drain contact 242 is recessed between the gates 210, the ILD 220 is also disposed between the gates 210 (second and third gates) over the drain 202.

FIG. 6A is a top view after patterning the ILD 220 to form trenches 601, 602 over the source 201 and drain 202, respectively. FIG. 6B is a cross-sectional side view through the A-A axis of FIG. 6A. FIG. 6C is a cross-sectional side view through the B-B axis of FIG. 6A. For clarity, the ILD 220 is not shown in FIG. 6A.

The ILD 220 is removed down to the level of the first portion 231 of the source contact 241 and the first portion 231 of the drain contact 242. The ILD 220 between the gates 210 (second and third gates) over the drain 202 is removed.

The trench 601 over the source 201 extends substantially over the length of the first portion 231 (see FIG. 6A). The trench 601 thus extends over the fins 203 in the fin array (see FIG. 3A). The trench 601 also extends over portions of the gates 210 (first and second gates), including portions of the gate spacer 212 and gate cap 211.

The trench 602 over the drain 202 extends over a smaller area than the trench 601. The trench 601 extends over only a portion of the first portion 231 of the drain contact 242. Instead of extending over all of the fins 203 in the fin array between the gates like trench 601 (see FIG. 3A), trench 602 extends over fewer fins. Trench 602 extends over fewer fins 203 than trench 601.

FIG. 7A is a top view after depositing a conductive material in the trenches 601, 602 to form the second portion 232 of the source contact 241 and the second portion 232 of the drain contact 242. FIG. 7B is a cross-sectional side view through the A-A axis of FIG. 7A. FIG. 7C is a cross-sectional side view through the B-B axis of FIG. 7A. For clarity, the ILD 220 is not shown in FIG. 7A.

The second portions 232 of the source and drain contacts 241, 242 may be formed by depositing a conductive material in the trenches 601, 602, as described above for first portions 231 in FIGS. 4A and 4B. A planarization process, for example, CMP, is then performed to remove excess materials from the surface of the ILD 220.

The second portion 232 of the source contact 241 is positioned above the gates 210 and contacts the gate caps 211. The width second portion 232 of the source contact 241 is larger than the width of the first portion 231, which is constrained by the distance between the gates 210.

The second portion 232 of the drain contact 242 is positioned below the top of the gates 210 and above the top of the gates 210. The second portion 232 of the drain contact 242 has a portion that has the same width as the first portion 231 (between the gates 210) and a portion that is wider than the first portion 231 (above the gates 210)

FIG. 8A is a top view showing the source contact 241 and the drain contact 242. FIG. 8B is a cross-sectional side view through the S-S axis (source side) of FIG. 8A. FIG. 8C is a cross-sectional side view through the D-D (drain side) axis of FIG. 8A. Epitaxial growth 801 is shown on the fins 203.

The first portions 231 on both the source side (FIG. 8B) and the drain side (FIG. 8C) extend over and around all of the fins 203 in the fin array between the gates. The second portion 232 on the source side also extends over all of the fins 203 in the fin array (FIG. 8B). Second portion 232 on the drain side (FIG. 8C) has a length (L2) that is smaller than the length (L1) of the second portion 232 on the source side (FIG. 8B).

In some embodiments, the length (L2) of the second portion 232 on the drain side is less than half of the length L1 of the second portion 232 on the source side. In some embodiments, the length (L2) of the second portion 232 on the drain side is in a range from about 20 to about 50 nm, and the length L1 of the second portion 232 on the source side is in a range from about 50 to about 500.

Because the first portion 231 on the drain side is also recessed (see FIGS. 4A and 4B), the first portion 231 on the drain side has a height (H2) that is less than the height (H1) on the source side (compare FIGS. 8B and 8C). In some embodiments, the height (H2) of the first portion 231 on the drain side is less than half of the height H1 of the first portion 231 on the source side. In other embodiments, the height (H2) of the first portion 231 on the drain side is in a range from about 20 to about 40 nm, and the height H1 of the first portion 231 on the source side is in a range from about 40 to about 100 nm.

Because the second portion 232 on the drain side contacts the first portion 231, which is recessed, the second portion 232 extends between the gates and has a height (H4) that is greater than the height (H3) of the second portion 232 on the source side (compare FIGS. 8C and 8B). In some embodiments, the height (H4) of the second portion 232 on the drain side is in a range from about 80 to about 150 nm, and the height (H3) of the second portion 232 on the source side is in a range from about 50 to about 90 nm. In other embodiments, the height (H2) of the first portion 231 on the drain side plus the height (H4) of the second portion 232 on the drain side is substantially the same the height (H1) of the first portion 231 on the source side plus the height (H3) of the second portion 232 on the source side.

As described above, various embodiments described herein provide semiconductor devices and methods of making semiconductor devices to mitigate parasitic capacitance that may result from a SAC. The SAC includes two portions, a first portion between the gates and a second portion over the gates. On the source side, the first and second portions of the SAC are disposed on multiple fins and overlap with the gate. The source side structure reduces resistance. On the drain side, the first portion between the gates is positioned on multiple fins, but the first portion is recessed to a level below the top of the gate to reduce parasitic capacitance. The second portion of the SAC on the drain side only overlaps with a small portion of the gate. Although the asymmetric SAC configuration may increase resistance, the reduced drain side parasitic capacitance (Miller Effect) may have a greater effect on device performance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a source and a drain formed in a substrate;
   a first gate and a second gate disposed on the source, and the second gate and a third gate disposed on the drain;
   a source contact formed over the source and between the first gate and the second gate, the source contact comprising a first portion and a second portion, the first portion being in contact with the source and extending between the first gate and second gate, and the second portion contacting the first portion and extending over the first gate and the second gate; and
   a drain contact formed over the drain and between the second gate and the third gate, the drain contact comprising a first portion and a second portion, the first portion positioned in contact with the drain, extending between the second gate and the third gate, and recessed with respect to the first portion of the source contact such that the first portion of the source contact has a thickness that is greater than a thickness of the first portion of the drain contact, the second portion positioned in contact with the first portion and extending between and over the second gate and the third gate, and the second portion of the source contact has a thickness than is smaller than the second portion of the drain contact.

2. The semiconductor device of claim 1, wherein the first portion of the source contact has a thickness in a range from about 20 to about 40 nm, and the first portion of the drain contact has a thickness in a range from about 40 to about 100 nm.

3. The semiconductor device of claim 1, wherein the first portion of the drain contact is recessed to a level below the second gate and the third gate.

4. The semiconductor device of claim 1, wherein the second portion of the drain contact has a length that is less than the length of the second portion of the source contact.

5. The semiconductor device of claim 1, wherein the second portion of the drain contact has a length in a range from about 20 to about 50 nm, and the second portion of the source contact has a length in a range from about 50 to about 500 nm.

6. A semiconductor device, comprising:
   a source and a drain formed in a substrate;
   a first gate and a second gate disposed on the source, the second gate and a third gate disposed on the drain, and the first gate, the second gate, and the third gate each having a spacer arranged on a sidewall;
   a source contact formed over the source and between the first gate and the second gate, the source contact comprising a first portion and a second portion, the first portion being in contact with the source and extending from the spacer of the first gate to the spacer of the second gate, and the second portion contacting the first portion and extending over and contacting the spacer of the first gate and the spacer of the second gate; and
   a drain contact formed over the drain and between the second gate and the third gate, the drain contact comprising a first portion and a second portion, the first portion positioned in contact with the drain, extending from the spacer of the second gate to the spacer of the third gate, and recessed with respect to the first portion of the source contact such that the first portion of the source contact has a thickness that is greater than a thickness of the first portion of the drain contact, the second portion positioned in contact with the first portion over a central region of the first portion, extending between the second gate and the third gate from the spacer of the second gate to the spacer of the third gate, and extending over and contacting the spacer of the second gate and the spacer of the third gate;
   wherein the second portion of the source contact has a thickness than is smaller than the second portion of the drain contact.

* * * * *